(12) United States Patent  
Ota

(10) Patent No.: US 8,681,575 B2  
(45) Date of Patent: Mar. 25, 2014

(54) SEMICONDUCTOR DEVICE

(75) Inventor: Satoshi Ota, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 353 days.

(21) Appl. No.: 13/235,675

(22) Filed: Sep. 19, 2011

(65) Prior Publication Data

US 2012/0243351 A1    Sep. 27, 2012

(30) Foreign Application Priority Data

Mar. 24, 2011   (JP) .................................. 2011-065639

(51) Int. Cl.
*G11C 7/00* (2006.01)

(52) U.S. Cl.
USPC .................... 365/193; 365/194; 365/233.1

(58) Field of Classification Search
USPC ...................................... 365/193, 194, 233.1
See application file for complete search history.

(56) References Cited

U.S. PATENT DOCUMENTS

| | | | | |
|---|---|---|---|---|
| 4,984,217 A * | 1/1991 | Sato | ........................ | 365/230.09 |
| 6,215,726 B1 * | 4/2001 | Kubo | ....................... | 365/233.17 |
| 6,717,887 B1 * | 4/2004 | Kono et al. | ............... | 365/189.14 |
| 7,522,459 B2 * | 4/2009 | Do | ................................. | 365/193 |
| 7,668,679 B2 | 2/2010 | Best | | |
| 7,793,063 B1 | 9/2010 | White et al. | | |
| 7,818,601 B2 | 10/2010 | LaBerge | | |
| 2003/0147299 A1 * | 8/2003 | Setogawa | ...................... | 365/233 |
| 2006/0245101 A1 * | 11/2006 | Do | ................................... | 360/48 |
| 2008/0012615 A1 * | 1/2008 | Park | .............................. | 327/158 |
| 2009/0168547 A1 * | 7/2009 | Lee | ........................... | 365/189.05 |
| 2010/0165758 A1 * | 7/2010 | Park et al. | ..................... | 365/193 |
| 2013/0141994 A1 * | 6/2013 | Ito et al. | ....................... | 365/193 |

FOREIGN PATENT DOCUMENTS

JP          2007-109203       4/2007

* cited by examiner

*Primary Examiner* — Tuan T. Nguyen  
(74) *Attorney, Agent, or Firm* — White & Case LLP

(57) ABSTRACT

A semiconductor device controls read-out operation of a semiconductor memory that outputs a parallel data signal and a strobe signal at a timing in synchronism with each other. The semiconductor device has a first phase control circuit configured to output a delay strobe signal which delays the strobe signal for a variable delay time, a second phase control circuit configured to output a re-delay strobe signal which delays the delay strobe signal for a variable delay time, a first hold circuit configured to hold the parallel data signal at an edge of the delay strobe signal, a second hold circuit configured to hold the parallel data signal at an edge of the re-delay strobe signal, and a control circuit configured to adjust a delay time of the first phase control circuit so that the second hold circuit performs a hold operation at a signal transition timing of the parallel data signal.

20 Claims, 5 Drawing Sheets

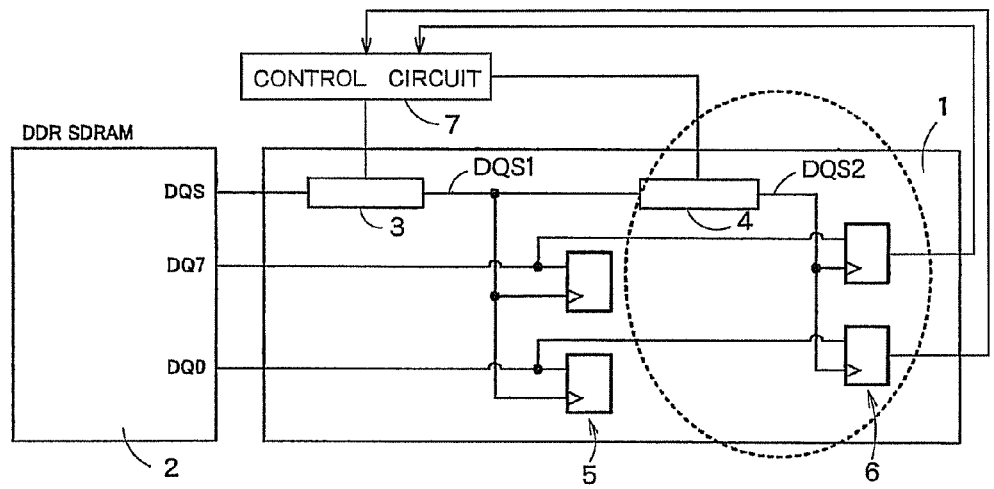
F I G. 1
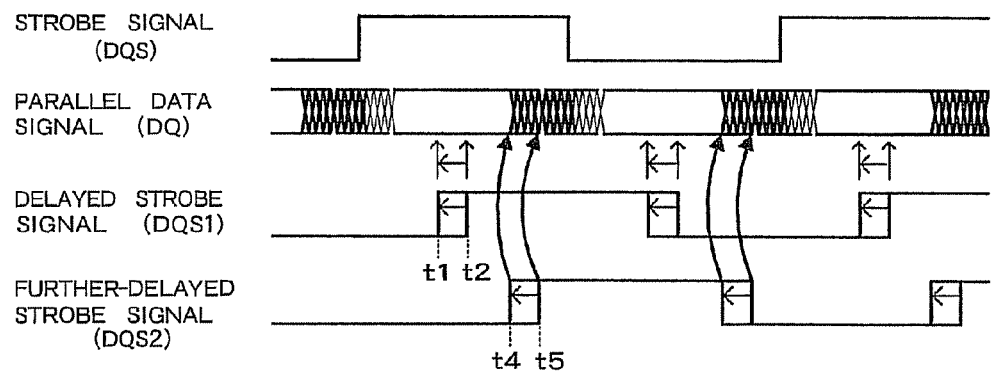
F I G. 2
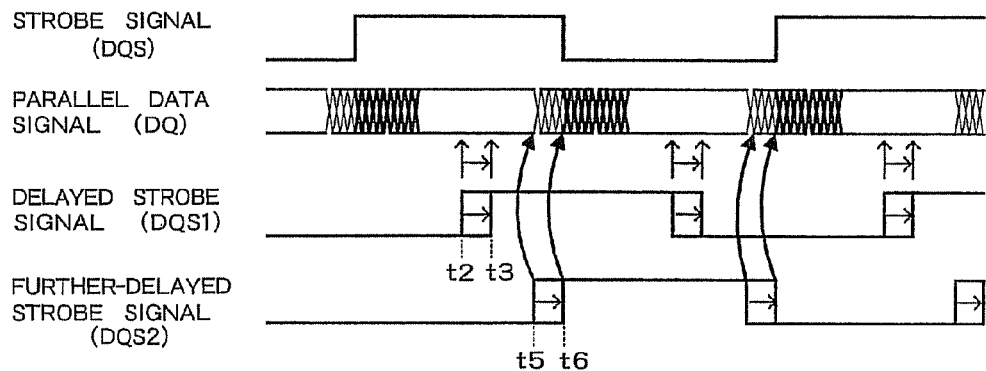
F I G. 3

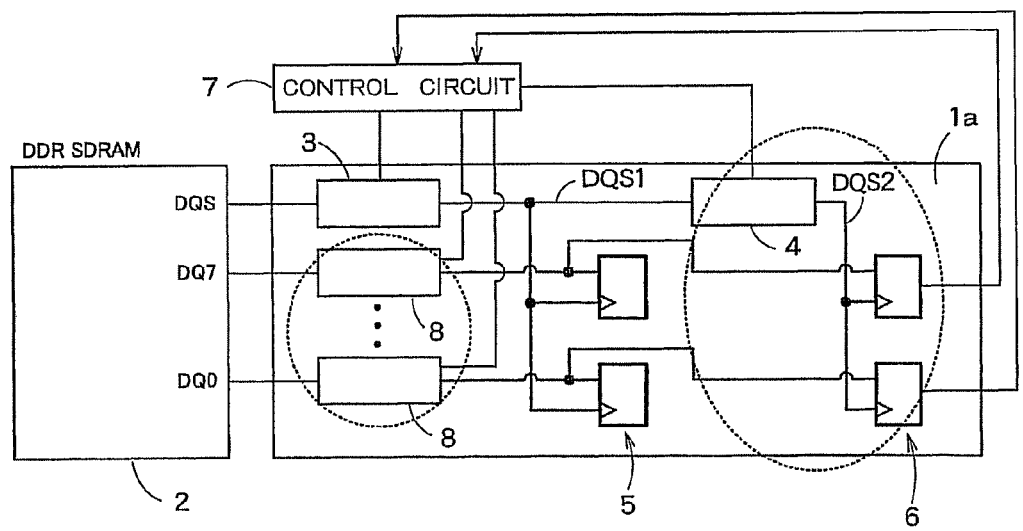
F I G. 5
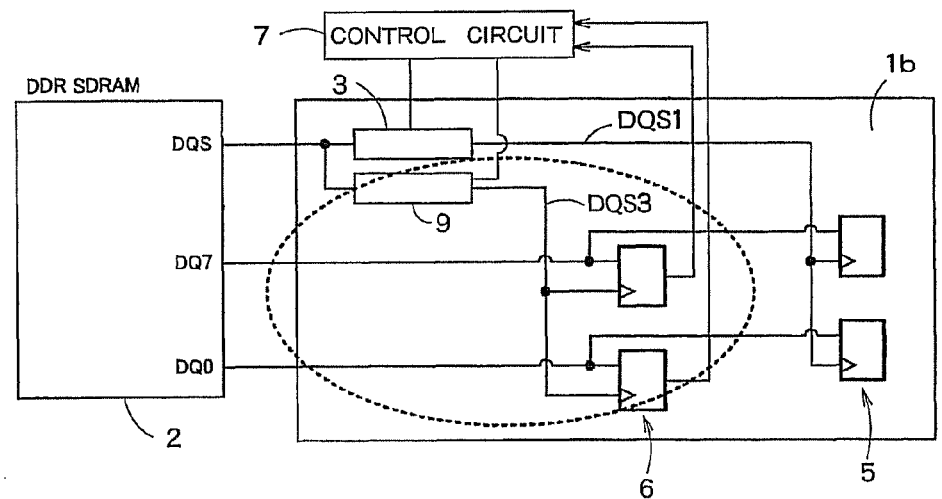
F I G. 6

US 8,681,575 B2

SEMICONDUCTOR DEVICE

CROSS REFERENCE TO RELATED APPLICATIONS

This application is based upon and claims the benefit of priority from the prior Japanese Patent Application No. 2011-65639, filed on Mar. 24, 2011, the entire contents of which are incorporated herein by reference.

FIELD

Embodiments of the present invention relate to a semiconductor device that performs read control of a semiconductor memory that outputs a parallel data signal and a strobe signal at a timing at which the signals are in synchronism with each other.

BACKGROUND

A SDRAM outputs a parallel data signal and a strobe signal at the same timing. Therefore, a read control circuit for the SDRAM delays the phase of the strobe signal by 90 degrees relative to the parallel data signal output from the SDRAM and captures the parallel data signal at an edge of the delayed strobe signal.

A delay circuit is used for delaying a strobe signal. At a low speed (transfer rate) of reading a parallel data signal from a SDRAM, a stable read operation can be performed even if the delay amount of the delay circuit is fixed at a specific amount.

However, as the transfer rate becomes higher, the timing deviation among data bits of the parallel data signal or between the parallel data signal and the strobe signal cannot be ignored. The timing deviation is caused by the effect of change in supply voltage and temperature (VT change) at a higher transfer rate. Therefore, when the delay amount of the delay circuit is fixed at a specific amount, it is difficult to perform a stable read operation at a higher transfer rate.

For the reason above, a technique has been proposed to measure the maximum and minimum delay amounts settable at the delay circuit and to set a delay amount to the median value of the maximum and minimum delay amounts. However, this technique takes time for delay-amount setting. Therefore, the delay-amount setting has been conventionally performed only at the time of power-on or resetting. This leads to voltage or temperature fluctuation during an ordinary read-out operation of the SDRAM. By the fluctuation, even if a timing between data bits and a timing between the data bit and the strobe signal fluctuate, it was impossible to set delay-amount in real time in conformity to the fluctuation.

BRIEF DESCRIPTION OF THE DRAWINGS

FIG. 1 is a block diagram schematically showing the configuration of a read control circuit 1 according to a first embodiment;

FIG. 2 is a timing chart of the read control circuit 1 of FIG. 1;

FIG. 3 is a timing chart of the read control circuit 1 of FIG. 1;

FIG. 5 is a block diagram schematically showing the configuration of a read control circuit 1a according to a second embodiment;

FIG. 6 is a block diagram schematically showing the configuration of a read control circuit 1b according to a third embodiment;

DETAILED DESCRIPTION

Figure 4:
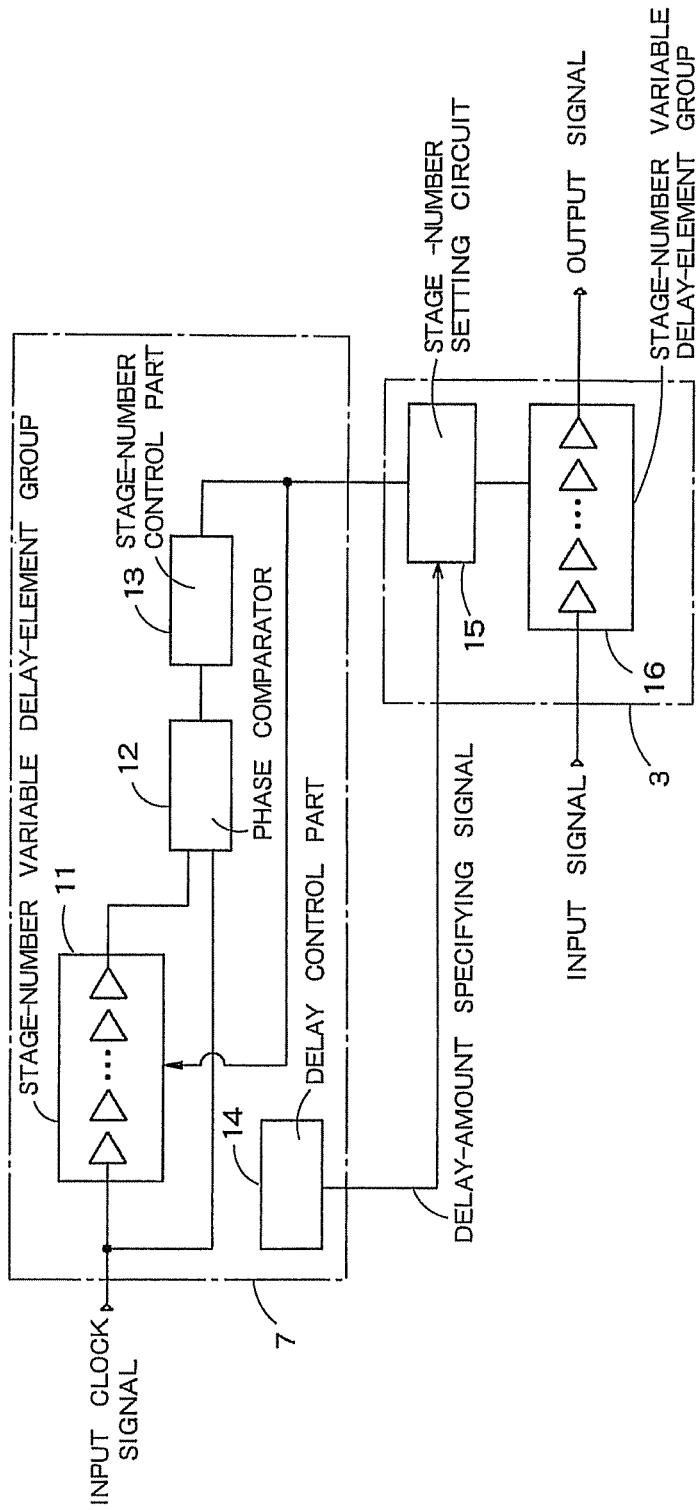
FIG. 4 is a block diagram schematically showing the configuration of first and second phase control circuits 3 and 4.

Embodiments will now be explained with reference to the accompanying drawings.

A semiconductor device according to one embodiment controls read-out operation of a semiconductor memory that outputs a parallel data signal and a strobe signal at a timing in synchronism with each other. The semiconductor device has a first phase control circuit configured to output a delay strobe signal which delays the strobe signal for a variable delay time, a second phase control circuit configured to output a re-delay strobe signal which delays the delay strobe signal for a variable delay time, a first hold circuit configured to hold the parallel data signal at an edge of the delay strobe signal, a second hold circuit configured to hold the parallel data signal at an edge of the re-delay strobe signal, and a control circuit configured to adjust a delay time of the first phase control circuit so that the second hold circuit performs a hold operation at a signal transition timing of the parallel data signal.

First Embodiment

FIG. 1 is a block diagram schematically showing the configuration of a read control circuit 1 according to a first embodiment. The read control circuit 1 of FIG. 1 performs read control of a DDR SDRAM 2, for example. The read control circuit 1 of FIG. 1 has a first phase control circuit 3 for delaying the phase of a strobe signal DQS, a second phase control circuit 4 for further delaying the phase of the strobe signal DQS1 delayed by the first phase control circuit 3, a first hold circuit 5 for holding (sampling) parallel data signals DQ0 to DQ7 at an edge of a delayed strobe signal DQS1 delayed by the first phase control circuit 3, a second hold circuit 6 for holding the parallel data signals DQ0 to DQ7 at an edge of a further-delayed strobe signal DQS2 delayed by the second phase control circuit 4, and a control circuit 7 for controlling the delay times of the first and second phase control circuits 3 and 4.

The control circuit 7 can adjust the delay time of the first phase control circuit 3 while fixing the delay time of the second phase control circuit 4 at a specific time. In more detail, the delay time of the second phase control circuit 4 is set to a fixed time that is a given hold time (for example, a hold time of the first hold circuit 5, that corresponds to a hold time defined depending on a semiconductor memory). Thereafter, the control circuit 7 adjusts the delay time of the first phase control circuit 3 so that the location of an edge of the further-delayed strobe signal DQS2 delayed by the second phase control circuit 4 meets a signal transition timing of the parallel data signals DQ0 to DQ7.

Accordingly, the second hold circuit 6 performs a hold operation at the signal transition timing of the parallel data signals DQ0 to DQ7. The hold operation of the second hold circuit 6 is preceded by a hold operation of the first hold circuit 5 by a specific time period that corresponds to a hold time of the first hold circuit 5.

The first phase control circuit 3 and the first hold circuit 5 take a main role of capturing the parallel data signals DQ0 to DQ7 from the SDRAM 2. In contrast, the second phase control circuit 4 and the second hold circuit 6 indicated by a broken line in FIG. 1 are additionally provided for performing control so that the first hold circuit 5 can have a hold time reliably when capturing (holding) the parallel data signals DQ0 to DQ7.

FIGS. 2 and 3 are timing charts of the read control circuit 1 of FIG. 1. The timing charts show timing waveforms of the strobe signal DQS, the parallel data signals DQ0 to DQ7, the delayed strobe signal DQS1 delayed by the first phase control circuit 3, and the further-delayed strobe signal DQS2 delayed by the second phase control circuit 4. An operation of the read control circuit 1 of FIG. 1 will be explained with reference to the timing charts, hereinbelow.

The SDRAM 2 outputs the parallel data signals DQ0 to DQ7 and the strobe signal DQS at the same timing. The read control circuit 1 basically performs a process of shifting a relative phase of the parallel data signals DQ0 to DQ7 and the strobe signal DQS by 90 degrees in order to hold the parallel data signals DQ0 to DQ7 at an edge of the strobe signal DQS. In detail, the first phase control circuit 3 delays the phase of the strobe signal DQS by about 90 degrees with respect to the phase of the parallel data signals DQ0 to DQ7.

As described above, even if the phase is accurately shifted by 90 degrees, there may be a deviation from 90 degrees due to the change in voltage, temperature, etc. Therefore, the control circuit 7 of the present embodiment sets the delay time of the second phase control circuit 4 in accordance with a given hold time. The delay time of the second phase control circuit 4 is also adjustable so as to meet a given hold time. However, it is not changed once set to any time period. Thereafter, the control circuit 7 adjusts the delay time of the first phase control circuit 3 so that an edge of the further-delayed strobe signal DQS2 delayed by the second phase control circuit 4 meets a transition timing of the parallel data signals DQ0 to DQ7.

With the adjustment described above, the delayed strobe signal DQS1 delayed by the first phase control circuit 3 shows phase lead to the further-delayed strobe signal DQS2 by the amount corresponding to the hold time. This results in that the first hold circuit 5 keeps the hold time reliably.

Suppose that there is a transition timing of the parallel data signals DQ0 to DQ7 at a time t5 in FIG. 2, for example. In this case, the delay time of the first phase control circuit 3 is adjusted so that an edge of the further-delayed strobe signal DQS2 appears at the time t5. The delay time of the second phase control circuit 4 has been previously set to a time corresponding to a given hold time (t5-t2). Therefore, the first hold circuit 5 performs a hold operation at a time t2 that is earlier than the time t5 by a period of the hold time (t5-t2). In this way, an edge of the delayed strobe signal DQS1 delayed by the first phase control circuit 3 is set to the time t2.

Suppose that, as shown in FIG. 2, that the transition timing of the parallel data signals DQ0 to DQ7 is shifted from the time t5 to a time t4 earlier than the time t5, due to the change in voltage, temperature, etc. In this case, the control circuit 7 adjusts the delay amount of the first phase control circuit 3 so that the edge of the further-delayed strobe signal DQS2 appears at the time t4. This results in that the edge of the delayed strobe signal DQS1 appears at a time t1 that is earlier than the time t4 by the period of the hold time so that the first hold circuit 5 performs a hold operation at the time t1.

Conversely, suppose that, as shown in FIG. 3, that the transition timing of the parallel data signals DQ0 to DQ7 is shifted from the time t5 to a time t6 later than the time t5, due to the change in voltage, temperature, etc. In this case, the control circuit 7 adjusts the delay amount of the first phase control circuit 3 so that the edge of the further-delayed strobe signal DQS2 appears later at the time t6. This results in that the edge of the delayed strobe signal DQS1 appears at a time t3 that is earlier than the time t6 by the period of the hold time so that the first hold circuit 5 performs a hold operation at the time t3.

As described above, the control circuit 7 searches for a signal transition timing of the parallel data signals DQ0 to DQ7 while varying the delay time of the first phase control circuit 3 but fixing the delay time of the second phase control circuit 4 at a specific time. When the signal transition timing is found, the first hold circuit 5 performs a hold operation at a time earlier than the signal transition timing by a period of a hold time. Therefore, the first hold circuit 5 can keep the hold time reliably.

As described above, in order to determine whether there is a signal transition timing in the parallel data signals DQ0 to DQ7 held by the second hold circuit 6, the control circuit 7 have to contain a specific bitstream in the parallel data signals DQ0 to DQ7 to be used for determination of the signal transition timing. The bitstream has a train of 0s and 1s that change before and after the signal transition timing, for example.

The following are preferable for the read control circuit 1 to perform an initial operation. A dummy bitstream to be used for determination of a signal transition timing is contained in the parallel data signals DQ0 to DQ7. Then, the delay-time adjustments described above are always performed to the first and second phase control circuits 3 and 4, with the initial operation. And then, while a normal reading operation is being performed to the SDRAM 2, it is preferable to perform the delay-time adjustments described above to the first and second phase control circuits 3 and 4 at the timing at which a bitstream usable for determination of a signal transition timing appears in the parallel data signals DQ0 to DQ7.

In this way, the control circuit 7 always performs the delay-time adjustments to the first and second phase control circuits 3 and 4 in the initialization. In addition, the control circuit 7 always performs the delay-time adjustments in a normal reading operation, after the initial operation. Therefore, the delay amounts of the first and second phase control circuits 3 and 4 can be optimized irrespective of the change in voltage, temperature, etc.

As described above, in the first embodiment, the delay time of the first phase control circuit 3 is adjusted by the control circuit 7, whereas the delay time of the second phase control circuit 4 is previously fixed at a given hold time. The hold time set in the second phase control circuit 4 is decided in a design stage under consideration of the performance of the SDRAM 2, a delay value of signal travel on a circuit board, a delay value of a semiconductor package, a delay value in a chip, a hold time of the first hold circuit 5, etc.

FIG. 4 is a block diagram showing an example of the internal configuration of the first and second phase control circuits 3 and 4, and the control circuit 7. FIG. 4 shows an internal configuration using a DLL (Delay Locked Loop) circuit. However, the internal configuration of the first and second phase control circuits 3 and 4 is not limited to that shown in FIG. 4. For example, an analog position control circuit, such as PI (Phase Interpolator) may be used instead of the DLL circuit. Accordingly, the first and second phase control circuits 3 and 4 are generally configured with a position control circuit. Explained hereinbelow with respect to FIG. 4 is an example in which the first and second phase control circuits 3 and 4 are configured with the DLL circuit.

Shown in FIG. 4 is an example of the internal configuration of the control circuit 7 and the first phase control circuit 3 of FIG. 1. The second phase control circuit 4 can also be configured in the same manner as the first phase control circuit 3.

The control circuit 7 of FIG. 4 has a stage-number variable delay-element group 11, a phase comparator 12, a stage-number control part 13, and a delay control part 14. The first phase control circuit 3 of FIG. 4 has a stage-number setting circuit 15 and a stage-number variable delay-element group 16.

The stage-number variable delay-element groups 11 and 16 are composed of a large number of series-connected delay elements. The number of stages of the stage-number variable delay-element group 11 is varied by the stage-number control part 13. The number of stages of the stage-number variable delay-element group 16 is varied by the stage-number setting circuit 15.

The phase comparator 12 detects a phase difference between an input clock signal and a signal output from the stage-number variable delay-element group 11 after the input clock signal passes therethrough. The stage-number control part 13 detects the number of stages of delay elements corresponding to one cycle of the input clock signal. A delay stage-number setting signal output from the stage-number control part 13 is input to the stage-number setting circuit 15 in the first phase control circuit 3.

The delay control part 14 generates a delay-amount specifying signal corresponding to a delay time of the first phase control circuit 3. The delay-amount specifying signal is input to the stage-number setting circuit 15 in the first phase control circuit 3.

The stage-number setting circuit 15 sets the number of stages of the delay elements of the stage-number variable delay-element group 16 based on the stage-number setting signal from the stage-number control part 13 and the delay-amount specifying signal from the delay control part 14. Suppose that the delay-amount specifying signal specifies a phase of 90 degrees. In this case, the stage-number setting circuit 15 sets the number of stages of delay elements to ¼ of the number of stages of delay elements output from the stage-number control part 13 and set in the stage-number variable delay-element group 11.

As described above, in the first embodiment, the first and second phase control circuits 3 and 4 are connected in series to each other. An adjustment is made so that an edge of the further-delayed strobe signal DQS2 output from the later-stage second phase control circuit 4 appears at a signal transition timing of the parallel data signals DQ0 to DQ7. Another adjustment is made so that an edge of the delayed strobe signal DQS1 appears at a time that is earlier by the period of the hold time of the first hold circuit 5 with respect to the location of the edge mentioned above as a reference point. Then, the first hold circuit 5 holds the parallel data signals DQ0 to DQ7 at the latter-mentioned edge. In this way, the first hold circuit 5 keeps the hold time to stably and reliably hold the parallel data signals DQ0 to DQ7 with the delayed strobe signal DQS1 with no difficulty, irrespective of the change in voltage, temperature, etc Second Embodiment Explained in the first embodiment is an example in which the adjustment to a delay amount is made only to the strobe signal DQS. By contrast, in the second embodiment, the adjustment to a delay amount is made not only to the strobe signal DQS but also to the parallel data signals DQ0 to DQ7.

FIG. 5 is a block diagram schematically showing the configuration of a read control circuit 1a according to a second embodiment. In FIG. 5, the elements common to FIG. 1 are given the same reference signs or numerals. The different points between FIGS. 1 and 5 will be mainly explained hereinbelow.

The read control circuit 1a of FIG. 5 has a plurality of third phase control circuits 8 that can separately adjust the delay amounts of data bit signals DQ0 to DQ7 of the parallel data signals DQ0 to DQ7, in addition to the circuit configuration of the read control circuit 1. Each third phase control circuit 8 is provided for the corresponding data bit signal and independently adjusts the delay amount. The phase control circuits 8 are in all referred to as a third phase control circuit 8, hereinbelow.

The read control circuit 1a of FIG. 5 is configured in the same manner as the read control circuit 1, except for the additional third phase control circuit 8. The delay amount of the third phase control circuit 8 is adjusted by the control circuit 7 in the same way as the first and second phase control circuits 3 and 4 as described above. The third phase control circuit 8 has an internal configuration such as shown in FIG. 4. However, there is no restriction on the internal configuration of the third phase control circuit 8 as long as it can be adjusted by the control circuit 7.

Like the first embodiment, the control circuit 7 of FIG. 5 sets the delay time of the second phase control circuit 4 to a time corresponding to the period of a given hold time. Then, the control circuit 7 adjusts the delay time of the first phase control circuit 3 so that the second hold circuit 6 can perform a hold operation at a signal transition timing of the parallel data signals DQ0 to DQ7. Accordingly, the first hold circuit 5 holds the parallel data signals DQ0 to DQ7 at a time earlier than the signal transition timing by a period of the hold time. The operation so far is the same as the first embodiment.

In the second embodiment, the control circuit 7 adjusts the delay amount of the third phase control circuit 8 per data bit so as to give a smaller deviation to the timings of the data bit signals DQ0 to DQ7 in the parallel data signals DQ0 to DQ7, in parallel with the adjustment to the delay amount of the first phase control circuit 3.

With the third phase control circuit 8 provided as described above, the deviation of the timings among the data bit signals DQ01 to DQ7 becomes small. This results in wider timing window that can be stably held by the first hold circuit 5, achieving more stable and reliable holding of the parallel data signals DQ0 to DQ7.

A delay-amount adjustment to give a smaller deviation to the timing among the data bit signals DQ01 to DQ7 is the only purpose for the third phase control circuit 8. There is no purpose of an adjustment to give such a large delay to the first phase control circuit 3. Therefore, even if the first and third phase control circuits 3 and 8 are formed with the same internal configuration as shown in FIG. 4, the third phase control circuit 8 can be constituted by a drastically smaller number of stages of the delay elements of the stage-number variable delay-element group 11 in FIG. 4 than the first phase control circuit 3. Accordingly, the circuit area becomes not so large even if each third phase control circuit 8 is provided for the corresponding data bit signal.

As described above, in the second embodiment, the third phase control circuit 8 can adjust a delay amount for each data bit signal of the parallel data signals DQ0 to DQ7, in addition to the configuration of the first embodiment. Therefore, the timing window for the parallel data signals DQ0 to DQ7 can be widened to offer easy timing setting to the first hold circuit 5, thus achieving a more stable and reliable holding operation to the parallel data signals DQ0 to DQ7 with no difficulty.

In the first and second embodiments, the delay strobe signal DQS1 being the output signal of the first phase control circuit 3 is input to the second phase control circuit 4. As the other option, the strobe signal DQS may directly be also input to the second phase control circuit 4 to generate a re-delay strobe signal DQS2. In this case, if the control circuit 7 matches a phase difference between the delay strobe signal DQS1 and the re-delay strobe signal DQS2 to an arbitrary hold time, it is possible to realize the present embodiment.

Third Embodiment

It is the precondition for the first and second embodiments that the first hold circuit 5 keeps a hold time for holding the parallel data signals DQ0 to DQ7 reliably at an edge of the delayed strobe signal DQS1. However, it is also preferable to perform control to keep a setup time reliably.

The setup time is decided in a design stage under consideration of the performance of the SDRAM 2, a delay value of signal travel on a circuit board, a delay value of a semiconductor package, a delay value in a chip, the setup time of the first hold circuit 5, etc.

FIG. 6 is a block diagram schematically showing the configuration of a read control circuit 1b according to a third embodiment. The read control circuit 1b of FIG. 6 has a first phase control circuit 3 for delaying the strobe signal DQS from the SDRAM 2, a second phase control circuit 9 for delaying the strobe signal DQS from the SDRAM 2 separately from the first phase control circuit 3, a first hold circuit 5 for holding the parallel data signals DQ0 to DQ7 at an edge of a first delayed strobe signal DQS1 delayed by the first phase control circuit 3, a second hold circuit 6 for holding the parallel data signals DQ0 to DQ7 at an edge of a second delayed strobe signal DQS3 delayed by the second phase control circuit 9, and a control circuit 7 for adjusting the delay amounts of the first and second phase control circuits 3 and 9 separately.

The first phase control circuit 3 and the first hold circuit 5 take a main role of capturing the parallel data signals DQ0 to DQ7 from the SDRAM 2. In contrast, the second phase control circuit 9 and the second hold circuit 6 indicated by a broken line in FIG. 6 are additionally provided for performing control so that the first hold circuit 5 can keep a setup time whenever capturing (holding) the parallel data signals DQ0 to DQ7.

Figure 7:
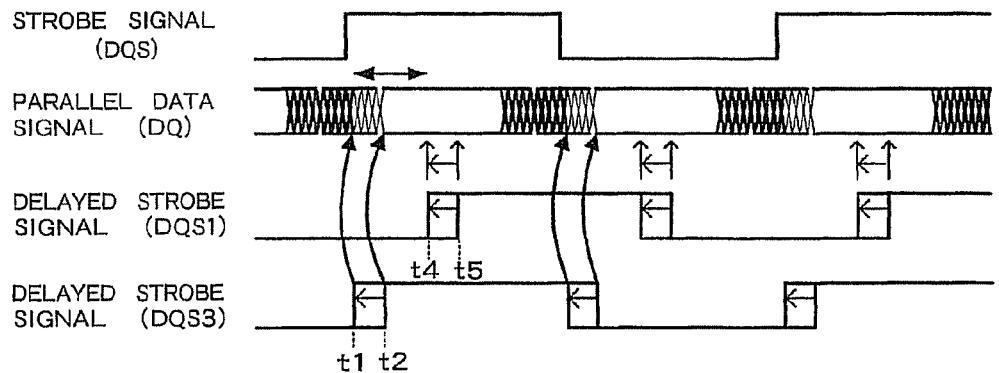
FIG. 7 is a timing chart of the read control circuit 1b of FIG. 6.
Figure 8:
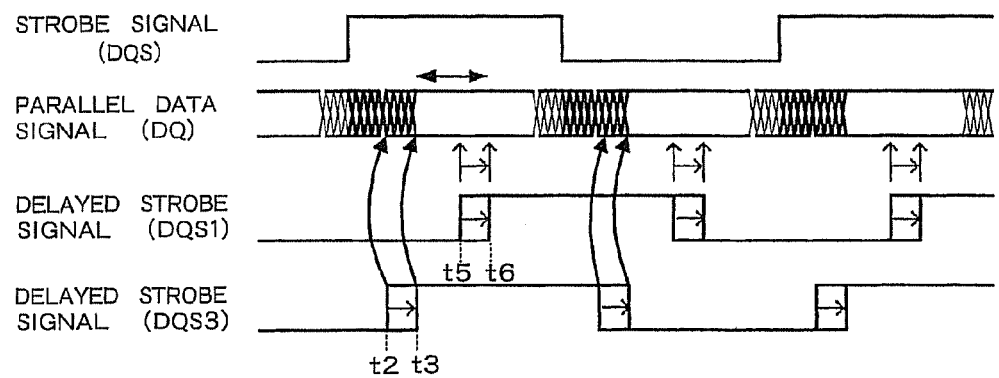
FIG. 8 is a timing chart of the read control circuit 1b of FIG. 6.

FIGS. 7 and 8 are timing charts of the read control circuit 1b of FIG. 6. The timing charts show timings of the strobe signal DQS, the parallel data signals DQ0 to DQ7, a first delayed strobe signal DQS1 delayed by the first phase control circuit 3, and a second delayed strobe signal DQS3 delayed by the second phase control circuit 9. An operation of the third embodiment will be explained with reference to FIGS. 7 and 8, hereinbelow.

The control circuit 7 adjusts the delay amount of the second phase control circuit 9 so that the second hold circuit 6 performs a hold operation at a signal transition timing of the parallel data signals DQ0 to DQ7. Then, the control circuit 7 adjusts the delay amount of the first phase control circuit 3 so that the first hold circuit 5 holds the parallel data signals DQ0 to DQ7 at a time later than the signal transition timing by a period of the setup time of the first hold circuit 5.

For example, the control circuit 7 adjusts the delay amount of the second phase control circuit 9 so that an edge of the second delayed strobe signal DQS3 delayed by the second phase control circuit 9 appears at a signal transition timing (time t2) of the parallel data signals DQ0 to DQ7. Then, the control circuit 7 adjusts the delay amount of the first phase control circuit 3 so that the first hold circuit 5 performs a hold operation at a time t5 later than the time t2 by a period of a setup time (t5−t2). With the adjustments, the difference in delay time between the first and second phase control circuits 3 and 9 is a time equal to an arbitrary setup time or a time matched to an arbitrary setup time, and the difference is a fixed time.

Suppose, as shown in FIG. 7, that the transition timing of the parallel data signals DQ0 to DQ7 is shifted from the time t2 to a time t1 earlier than the time t2 due to the change in voltage, temperature, etc. In this case, the control circuit 7 adjusts the delay amounts of the first and second phase control circuits 3 and 9 so that the edge of the second delayed strobe signal DQS3 appears at the time t1. Then, the control circuit 7 adjusts the delay amount of the first phase control circuit 3 so that an edge of the first delayed strobe signal DQS1 appears at a time t4 later than the time t1 by a period of the setup time.

Conversely, suppose, as shown in FIG. 8, that the transition timing of the parallel data signals DQ0 to DQ7 is shifted from the time t2 to a time t3 later than the time t2 due to the change in voltage, temperature, etc. In this case, the control circuit 7 adjusts the delay amounts of the first and second phase control circuits 3 and 9 so that the edge of the second delayed strobe signal DQS3 appears at the time t3. Then, the control circuit 7 adjusts the delay amount of the first phase control circuit 3 so that the edge of the first delayed strobe signal DQS1 appears at a time t6 later than the time t3 by a period of the setup time.

As described above, in the third embodiment, the delay times of the first and second phase control circuits 3 and 9 are adjusted so that the second hold circuit 6 performs a hold operation at a signal transition timing of the parallel data signals DQ0 to DQ7 and then the first hold circuit 5 performs a hold operation at a time later than the signal transition timing by a period of a given setup time. Therefore, the first hold circuit 5 can hold the parallel data signals DQ0 to DQ7 while always keeping the setup time even if there is a deviation of timing of the parallel data signals DQ0 to DQ7, the strobe signal DQS, etc. due to the change in voltage, temperature, etc., with no effect of the deviation.

Incidentally, the read control circuit 6 of FIG. 6 adjusts the delay amount of the first and second phase control circuits 3 and 9. Therefore, by changing the manner of adjusting the delay amount by the control circuit 7, similarly to the first and second embodiments, it is, possible to adopt the manner of adjustment which can assure the hold time of the first hold circuit 5.

That is, the control circuit 7 adjusts a delay time of the second phase control circuit 9 so that the second hold circuit 6 performs a hold operation at a signal transition timing of the parallel data signal DQ0 to DQ7, and adjusts a delay time of the first phase control circuit 3 so that the first hold circuit 5 performs a hold operation at a time that is later than a time at which the second hold circuit 6 performs the hold operation by a predetermined period or so that the first hold circuit 5 performs the hold operation at a time that is earlier than a time at which the second hold circuit 6 performs the hold operation by a hold time of the first hold circuit 5. Therefore, similarly to the first and second embodiments, it is possible to hold the parallel data signals DQ0 to DQ7 at a state of assuring the hold time of the first hold circuit 5.

Figure 9:
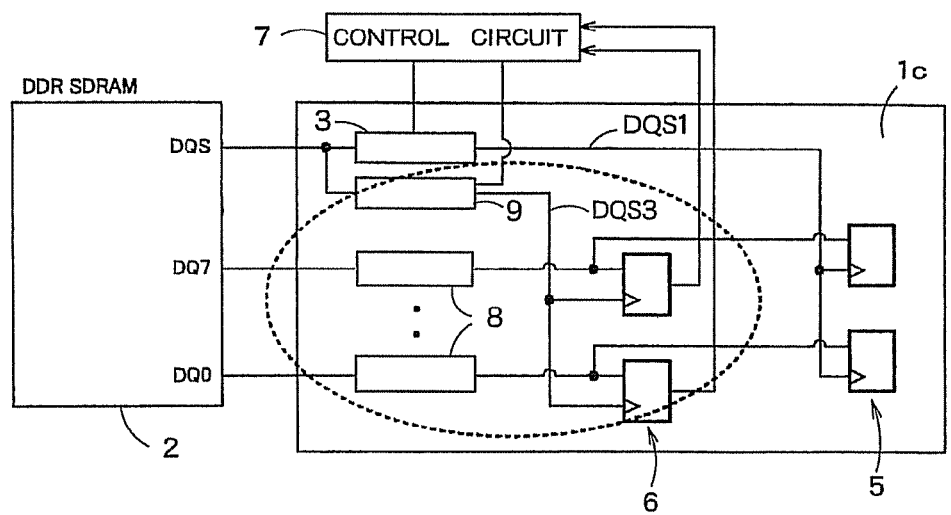
FIG. 9 is a block diagram showing a modification to FIG. 6.

The read control circuit 1b of FIG. 6 may be provided with the third phase control circuits 8 for separately adjusting the delay amounts of the data bit signals of the parallel data signals DQ0 to DQ7, like shown in FIG. 5. FIG. 9 is a block diagram schematically showing the configuration of a read control circuit 1c having a third phase control circuit 8 in addition to the read control circuit 1b of FIG. 6. With the third phase control circuit 8, the timing window for the parallel data signals DQ0 to DQ7 can be widened to achieve less restriction on the timing of a hold operation at the first hold circuit 5, thus achieving more stable holding of the parallel data signals DQ0 to DQ7.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device configured to control read-out operation of a semiconductor memory that outputs a parallel data signal and a strobe signal at a timing in synchronism with each other, comprising:
   a first phase control circuit configured to output a delay strobe signal which delays the strobe signal for a variable delay time;
   a second phase control circuit configured to output a re-delay strobe signal which delays the delay strobe signal for a variable delay time;
   a first hold circuit configured to hold the parallel data signal at an edge of the delay strobe signal;
   a second hold circuit configured to hold the parallel data signal at an edge of the re-delay strobe signal; and
   a control circuit configured to adjust a delay time of the first phase control circuit so that the second hold circuit performs a hold operation at a signal transition timing of the parallel data signal.

2. The semiconductor device of claim 1, wherein a delay time of the second phase control circuit is a fixed time that is set so as to meet a hold time of the first hold circuit and/or performance of the semiconductor device.

3. The semiconductor device of claim 2, wherein the control circuit searches for a signal transition timing of the parallel data signal to be input to the second hold circuit while varying the delay time of the first phase control circuit but fixing the delay time of the second phase control circuit.

4. The semiconductor device of claim 1 further comprising a plurality of third phase control circuits, each being provided for each data bit of the parallel data signal, and being configured to delay a corresponding data bit for an adjustable delay time,
   wherein the control circuit adjusts a delay time of each third phase control circuit for each data bit to give a smaller deviation of timing among the data bits in the parallel data signal when the delay time of the first phase control circuit is adjusted.

5. The semiconductor device of claim 4, wherein a range of adjustment to the delay time of the third phase control circuit is narrower than a range of adjustment to the delay time of the first phase control circuit.

6. The semiconductor device of claim 1, wherein the control circuit controls delay times of the first and second phase control circuits when the parallel data signal is a specific bitstream.

7. The semiconductor device of claim 6, wherein the specific bitstream is provided so that the control circuit can determine whether there is a signal transition timing of the parallel data signal.

8. The semiconductor device of claim 6, wherein the control circuit applies the specific bitstream to the parallel data signal at a time of power-on or resetting and adjusts the delay times of the first and second phase control circuits.

9. The semiconductor device of claim 6, wherein the control circuit adjusts the delay times of the first and second phase control circuits at a timing at which the specific bitstream appears in the parallel data signal during a normal read operation.

10. The semiconductor device of claim 1, wherein the control circuit comprises a DLL (Delay Locked Loop) circuit configured to variably adjust a delay time by switching number of stages of a plurality of series-connected delay elements, wherein each of the first and second phase control circuits comprises a delay circuit configured by a plurality of series-connected delay elements, the delay circuit being capable of adjusting number of stages by the control circuit.

11. A semiconductor device configured to control read-out operation of a semiconductor memory that outputs a parallel data signal and a strobe signal at a timing in synchronism with each other, comprising:
   a first phase control circuit configured to output a first delay strobe signal which delays the strobe signal for a variable delay time;
   a second phase control circuit configured to output a second delay strobe signal which delays the delay strobe signal for a variable delay time;
   a first hold circuit configured to hold the parallel data signal at an edge of the first delay strobe signal;
   a second hold circuit configured to hold the parallel data signal at an edge of the second delay strobe signal; and
   a control circuit configured to adjust a delay time of the second phase control circuit so that the second hold circuit performs a hold operation at a signal transition timing of the parallel data signal, and to adjust a delay time of the first phase control circuit so that the first hold circuit performs a hold operation at a time that is later than a time at which the second hold circuit performs the hold operation by a predetermined period or so that the first hold circuit performs the hold operation at a time that is earlier than a time at which the second hold circuit performs the hold operation by a hold time of the first hold circuit.

12. The semiconductor device of claim 11, wherein the predetermined time is a time substantially equal to a setup time or a hold time of the first hold circuit.

13. The semiconductor device of claim 11, wherein the control circuits adjusts delay times of the first and second phase control circuits so that the difference in a delay time between the first and second phase control circuits becomes a predetermined time.

14. The semiconductor device of claim 11 further comprising a plurality of third phase control circuits, each being provided for each data bit of the parallel data signal, and being configured to delay a corresponding data bit for an adjustable delay time,
   wherein the control circuit adjusts a delay time of each third phase control circuit for the corresponding data bit to give a smaller deviation of timing among the data bits in the parallel data signal when the delay time of the first phase control circuit is adjusted.

15. The semiconductor device of claim 14, wherein a range of adjustment to the delay time of the third phase control circuit is narrower than a range of adjustment to the delay time of the first phase control circuit.

16. The semiconductor device of claim 11, wherein the control circuit controls delay times of the first and second phase control circuits when the parallel data signal is a specific bitstream.

17. The semiconductor device of claim 16, wherein the specific bitstream is provided so that the control circuit can determine whether there is a signal transition timing of the parallel data signal.

18. The semiconductor device of claim 16, wherein the control circuit applies the specific bitstream to the parallel data signal at a time of power-on or resetting, to adjust the delay times of the first and second phase control circuits.

19. The semiconductor device of claim 16, wherein the control circuit adjusts the delay times of the first and second phase control circuits at a timing at which the specific bitstream appears in the parallel data signal during a normal read operation.

20. The semiconductor device of claim 11, wherein the control circuit comprises a DLL (Delay Locked Loop) circuit configured to variably adjust a delay time by switching number of stages of a plurality of series-connected delay elements, wherein each of the first and second phase control circuits comprises a delay circuit configured by a plurality of series-connected delay elements, the delay circuit being capable of adjusting number of stages by the control circuit.

\* \* \* \* \*